United States Patent
Ohta et al.

(10) Patent No.: US 7,185,425 B2
(45) Date of Patent: Mar. 6, 2007

(54) METHOD FOR CONNECTING PRINTED CIRCUIT BOARDS

(75) Inventors: Takashi Ohta, Hyogo (JP); Kazuaki Yamada, Hyogo (JP); Kiyoshi Tsujii, Hyogo (JP); Hidekazu Manabe, Aichi (JP)

(73) Assignees: Fujitsu Ten Limited, Kobe (JP); Toyota Jidosha Kabushiki Kaisha, Toyota (JP)

( * ) Notice: Subject to any disclaimer, the term of this patent is extended or adjusted under 35 U.S.C. 154(b) by 463 days.

(21) Appl. No.: 10/681,213

(22) Filed: Oct. 9, 2003

(65) Prior Publication Data

US 2004/0123457 A1    Jul. 1, 2004

(30) Foreign Application Priority Data

Oct. 9, 2002    (JP)    ............... 2002-295896

(51) Int. Cl.
   *H05K 3/34*    (2006.01)
(52) U.S. Cl. ............. 29/840; 29/827; 29/835; 29/837; 29/843; 29/845; 29/739; 29/740; 29/741; 29/564.6; 29/566.3; 29/412; 29/832
(58) Field of Classification Search ........... 29/825, 29/827, 832, 835, 837, 842, 845, 739, 740, 29/741, 564.6, 564.8, 566.2, 566.3, 412–415
   See application file for complete search history.

(56) References Cited

U.S. PATENT DOCUMENTS

| | | | | |
|---|---|---|---|---|
| 4,618,209 A | * | 10/1986 | Sonobe | ............... 439/395 |
| 4,785,533 A | * | 11/1988 | Seino et al. | ............ 29/827 |
| 5,953,803 A | * | 9/1999 | Hahn | ............ 29/243.56 |

FOREIGN PATENT DOCUMENTS

JP    A 10-229261    8/1998

* cited by examiner

*Primary Examiner*—Richard Chang
(74) *Attorney, Agent, or Firm*—Oliff & Berridge PLC (57) ABSTRACT

By forming a terminal at a tip of a lead part of a lead frame, and by fixing this terminal and a connecting pad which was formed on an upper surface of a first printed circuit board, the lead frame is attached to the first printed circuit board. By cutting off a frame part and a tie bar part from the lead frame which was attached to the first printed circuit board, the lead part is separated, and forming is applied to the lead part so as for its tip to be extended over the first printed board. After the lead part which is expanded upward is inserted into a through-hole which was opened in a second printed circuit board, by soldering the lead part and the through-hole, the first printed circuit board and the second printed circuit board are electrically connected.

10 Claims, 7 Drawing Sheets

METHOD FOR CONNECTING PRINTED CIRCUIT BOARDS

The present disclosure relates to the subject matter contained in Japanese Patent Application No.2002-295896 filed Oct. 9, 2002, which is incorporated herein by reference in its entirety.

BACKGROUND OF THE INVENTION

1. Field of the Invention

This invention relates to a connecting structure and a connecting method of printed circuit boards, and in particular, relates to a method for connecting printed circuit boards, which are disposed in a stacked manner.

2. Description of the Related Art

In order to control electric power to be supplied from a power supply to a load, a control module is inserted into a power supply line.

In this control module, it is common that, besides a power control device for controlling electric power, a control device for controlling this power control device is mounted thereon.

Therefore, it is normal that the control module includes two kinds of substrates, i.e., a control substrate on which the control device is mounted and a power substrate on which the power control device is mounted, and a copper system lead is used for an electric connection between these substrates.

It is usual that the lead is fixed to a predetermined position by a resinous frame (JP-A-10-229261; page 3 and FIG. 1).

SUMMARY OF THE INVENTION

The invention has an object to provide a method for connecting printed circuit boards in which printed circuit boards can be stacked and connected simply and precisely.

According to a first aspect of the invention, a method for connecting printed circuit boards includes forming a terminal at one end of a lead portion of a lead frame, fixing the terminal to a connecting pad formed on a surface of a first printed circuit board to attach the lead frame to the first printed circuit board, cutting off a frame portion and a tie bar portion from the lead frame, making the other end of the lead portion extend in an upward direction of the first printed circuit board, inserting the lead portion into a through hole defined in a second printed circuit board, and fixing the lead portion to the through hole to connect the first printed circuit board and the second printed circuit board electrically.

After the lead frame is attached to the first printed circuit board, the lead frame and the tie bar are removed, and the lead is made to extend in the upward direction of the first printed circuit board. Then, by inserting the lead portion into the through-hole defined in the second printed circuit board, the first printed circuit board and the second printed circuit board are connected.

DETAILED DESCRIPTION OF THE PREFERRED EMBODIMENT

Figure 1:
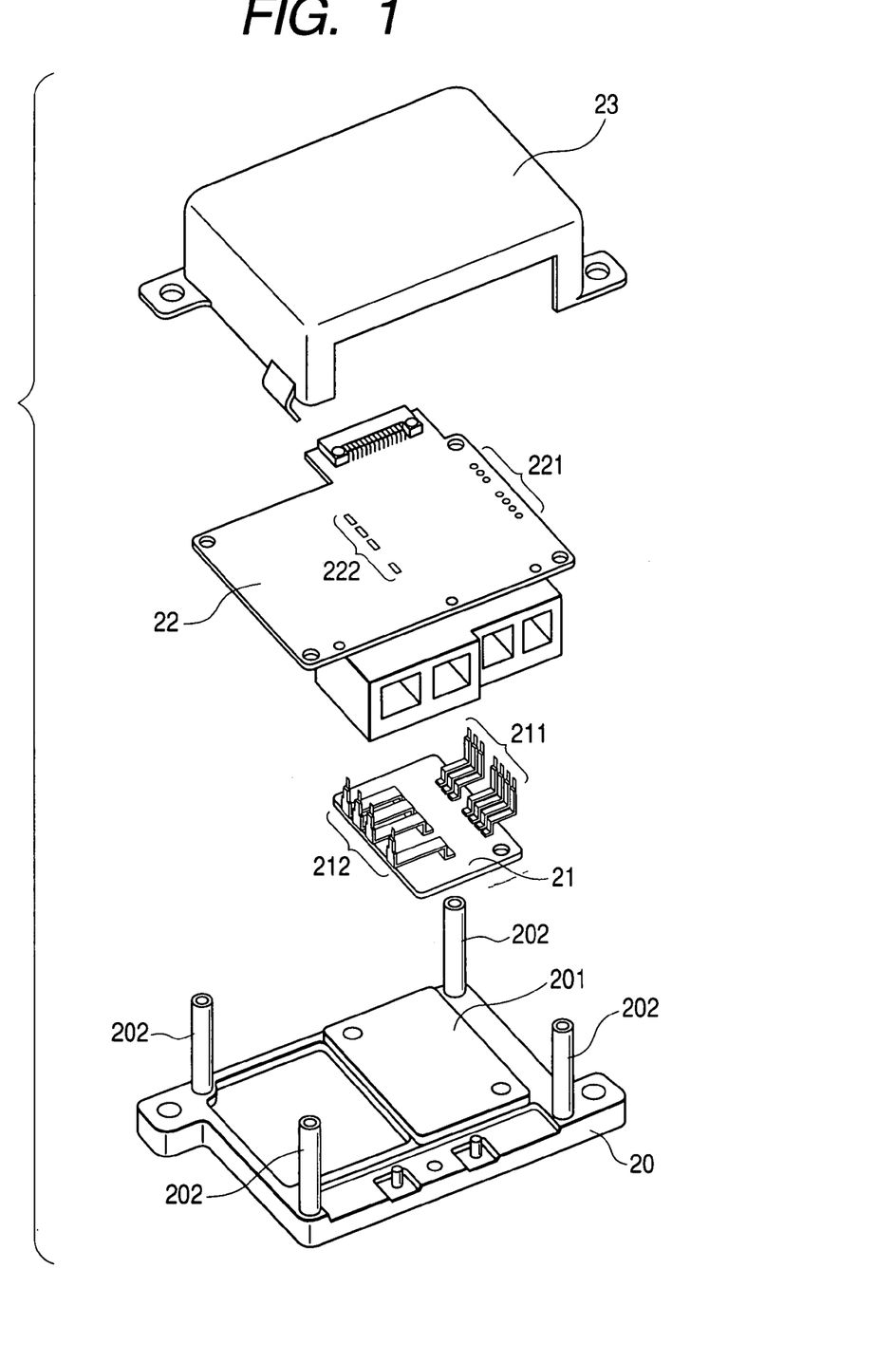
FIG. 1 is an exploded perspective view of a connecting structure of printed circuit boards according to the embodiment of the invention.

FIG. 1 is an exploded perspective view of a connecting structure of printed circuit boards according to an embodiment of the invention. The connecting structure includes a base 20, a power substrate 21, a control substrate 22 and a lid 23.

The base 20 is an aluminum casting product, and radiates heat generated by the power substrate, which is attached in closely contact thereto. The power substrate 21, the control substrate 22 and the lid 23 are fixed the base 20.

A power control device, which is for example IGBT (Insulated Gate Bipolar Transistor), is mounted on the power substrate 21. Also, crank type control leads 211 and power leads 212 are fixed to the power substrate 21 by soldering. However, there is no resinous frame as in the connecting structure described in the background of the invention. The control lead2 211 and the power leads 212 stand alone on the power substrate 21.

A method for attaching the control leads 211 and the power leads 212 to the power substrate 21 will be described later.

This power substrate 21 is closely contacted to and fixed by screw cramp to a bed 201, which is formed on the base 20 through an electrically insulating member.

The control substrate 22 on which a control device, which is for example a microcomputer, is mounted, is stacked above the power substrate 21 with a predetermined gap being formed between the control substrate 22 and the power substrate 21. In the control substrate 22, control through-holes 221 and power through-holes 222 are opened. When the control substrate 22 is stacked, the control leads 211 and the power leads 212 are inserted into the control through-holes 221 and the power through-holes 222, respectively.

After that, the control leads 211 and the power leads 212, and, the control through-holes 221 and the power through-holes 222 are electrically connected to each other by soldering.

In addition, the control substrate 22 is fixed by a screw to support pillars 202 formed at four corners of the base 20.

Finally, the lid 23 is fixed to the base 20 so that a component is finished.

Figure 2:
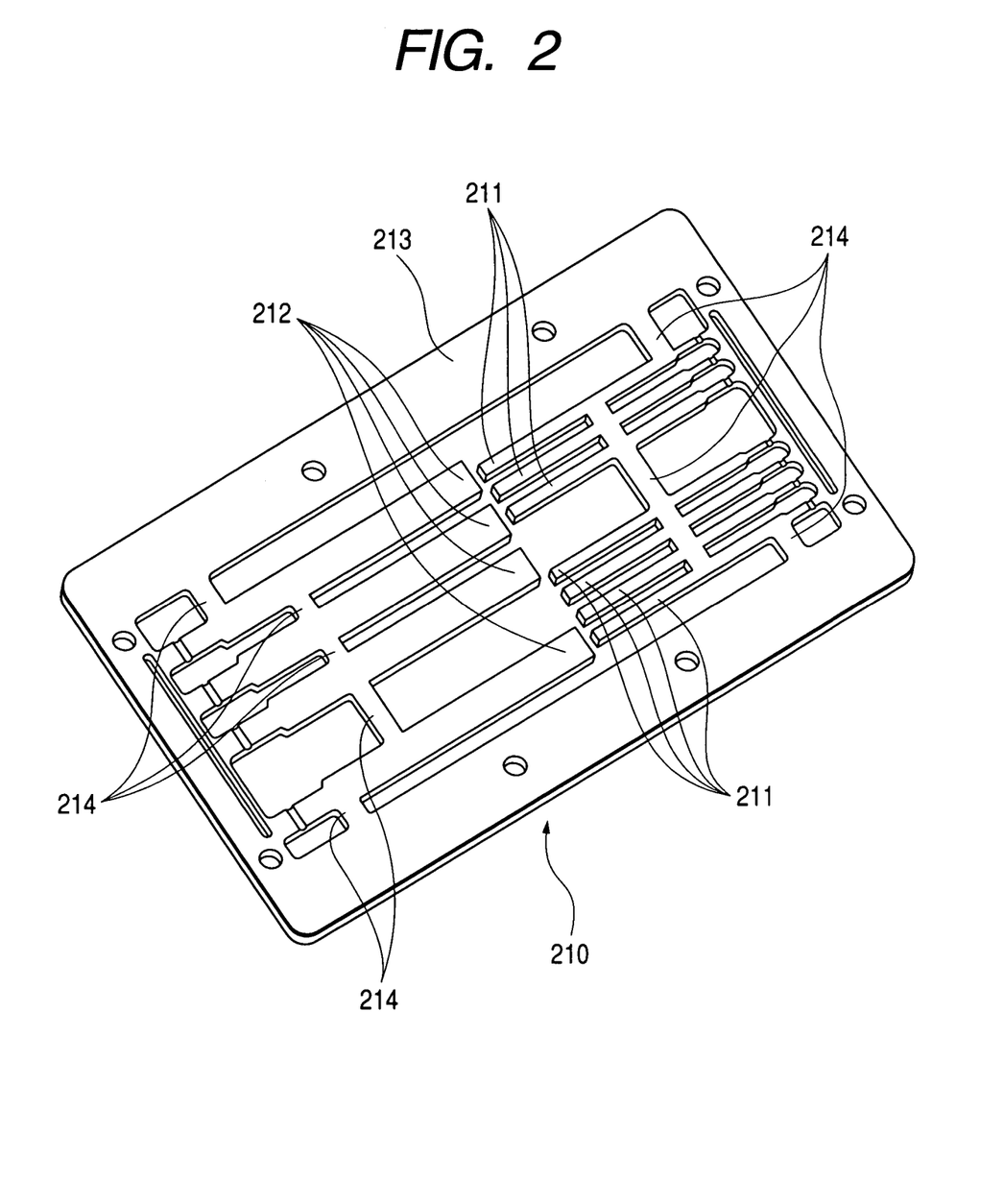
FIG. 2 is a perspective view (1) of a lead frame.

FIG. 2 is a perspective view (1) of the lead frame 210. the control leads 211 and the power leads 212 are extended toward inside from the frame 213. The frame 213 and the control leads 211 and the power leads 212, and, both of the control leads 211 and the power leads 212 are connected to each other by tie bars 214.

The lead frame having the above-described structure can be easily formed by punching out an aluminum plate.

Figure 3:
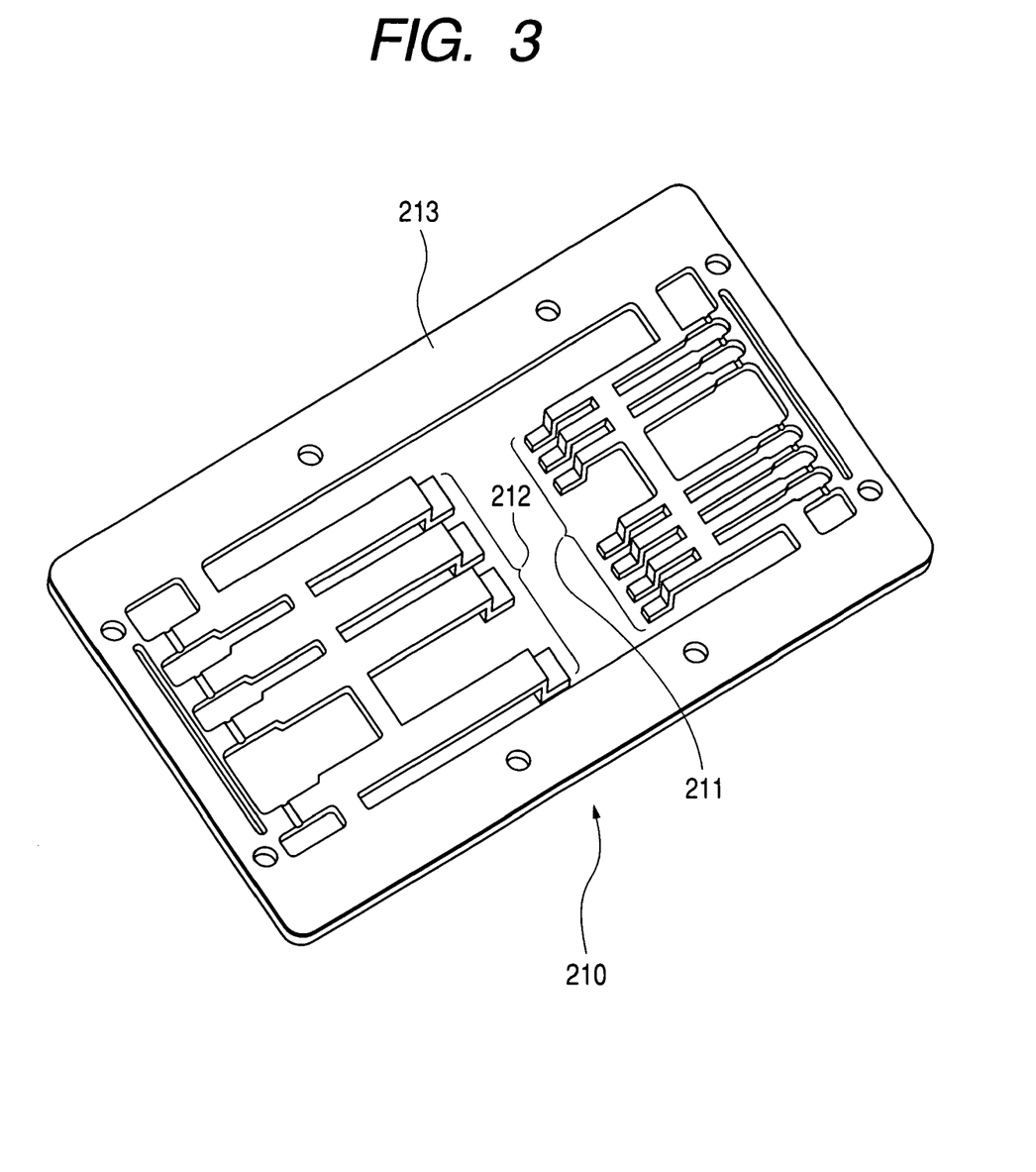
FIG. 3 is a perspective view (2) of the lead frame.

FIG. 3 is a perspective view (2) of the lead frame 210. Tip ends of the control leads 211 and the power leads 212 undergo press working to have a crank shape. Thereby, a terminal is formed.

FIGS. 4A–4C and 6F–6G are explanation views showing an assembling method of the connecting structure of printed circuit boards according to the embodiment of the invention. The lead frame 210, which has undergone the press working, is fixed to the power substrate 21 by soldering. In addition, in the figures subsequent to FIG. 4C, in order to easily understand the figures, one control lead 211 and one power lead 212 are shown. However, as shown in FIGS. 2 and 3, even in case that a plurality of control leads 211 and power leads 212 are disposed, this assembling method is also applicable thereto.

Figure 4A:
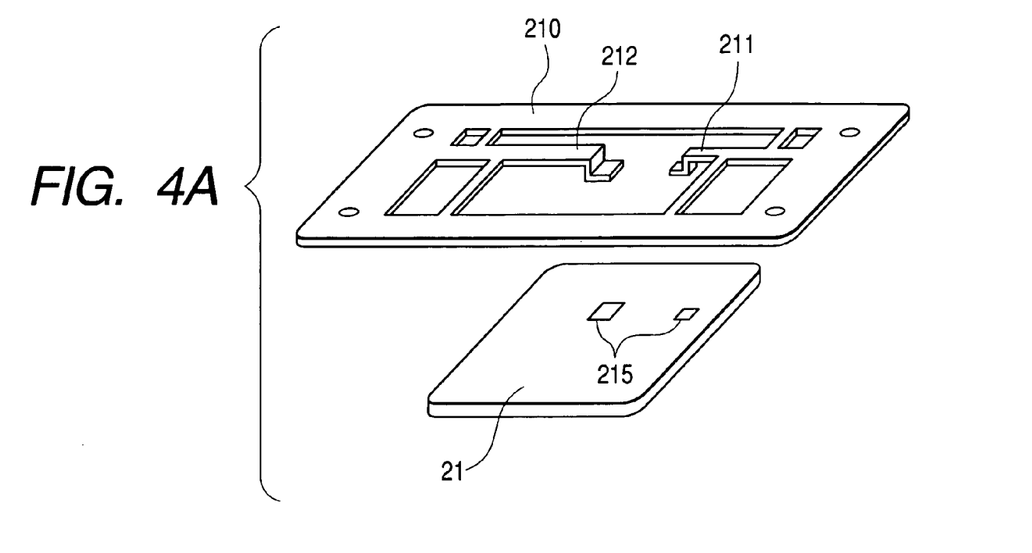
FIGS. 4A–4C is an explanation view (1) showing an assembling method of the connecting structure of printed circuit boards according to the embodiment of the invention.
Figures 4B, 4C:
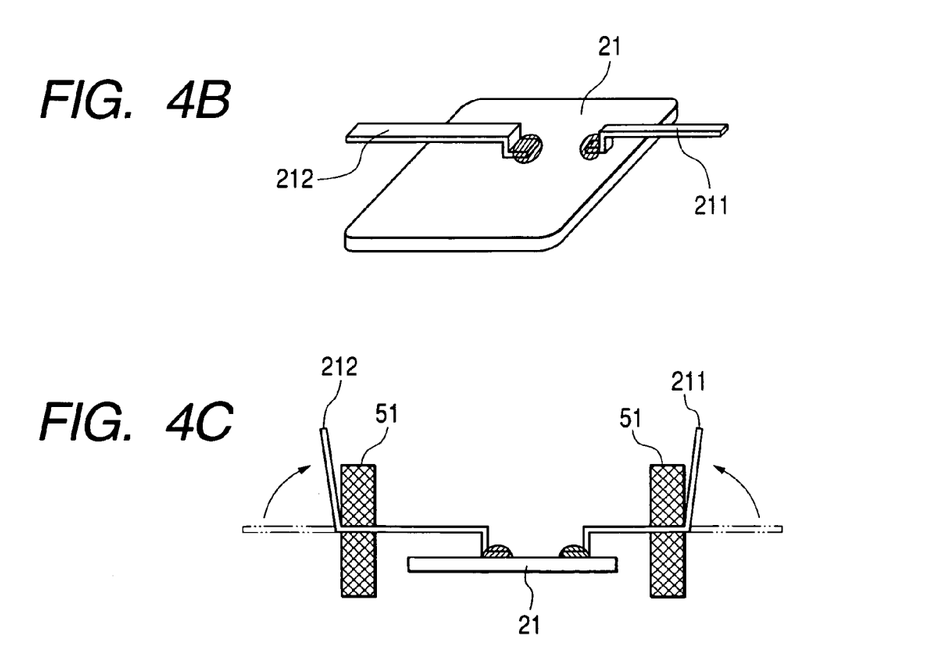

At this stage, since the control lead 211 and the power lead 212 are fixed to the frame 213, if the frame 213 is positioned with respect to the power substrate 21, there is no necessity to position each of the control lead 211 and the power lead 212 with respect to the power substrate 21.

On the power substrate 21, formed are connecting pads 215 to which terminals of the control lead 211 and the power lead 212 are attached. The terminals and the connecting pads 215 are connected by, for example, flow-soldering (A).

After that, the frame 213 and the tie bars 214 are cut off so that each of control lead 211 and power lead 212 are separated (B).

Next, folding positions of the control lead 211 and the power lead 212 are pinched by a damper 51, and by use of an appropriate method, carried out is a forming process in which tip ends of the control lead 211 and the power lead 212 are folded back upwardly. In addition, a folding angle is set to 85 degrees, which is smaller than 90 degrees by approximately 5 degrees, and the tip ends of the control lead 211 and the power lead 212 are formed in an expanded state toward outside (C).

That is, according to the embodiment of the invention, after the control lead 211 and the power lead 212 are attached to the power substrate 21, the control lead 211 and the power lead 212 undergo the forming process. Therefore, it is possible to correct, on the occasion of the forming process, misalignment between the control lead 211 and the control through-hole 222 and between the power lead 212 and the power through-hole 222 of the control substrate 22, which is caused due to attaching the frame 213 to the power substrate 21. Thus, it becomes possible to assure the relative positional precision therebetween.

Figure 5D:
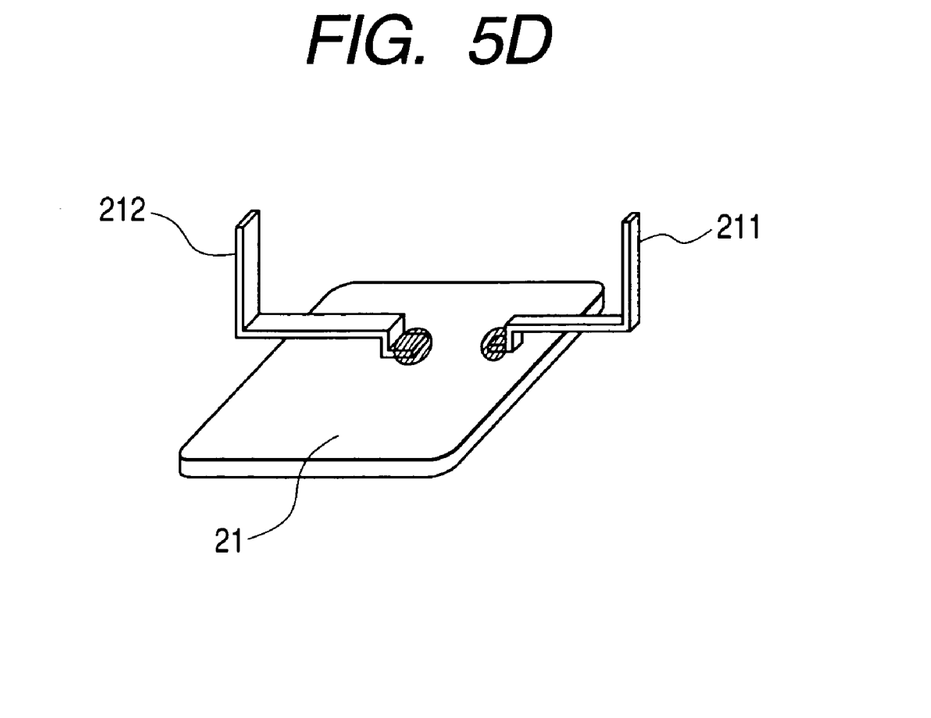
FIG. 5D–5E is an explanation view (2) showing an assembling method of the connecting structure of printed circuit boards according to the embodiment of the invention.

As a result, completed is the power substrate 21 to which the control lead 211 and the power lead 212 are fixed by soldering (D).

Figure 5E:
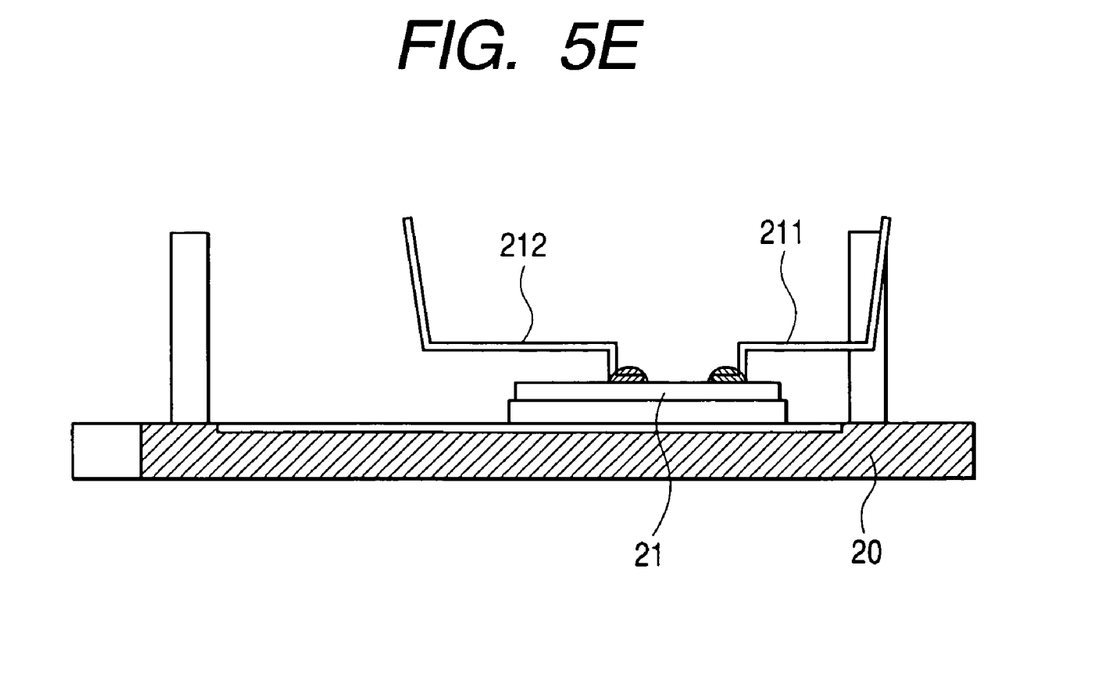

This power substrate 21 is disposed on the bed 201 of the base 20, and fixed to a top of the base 20 by an appropriate method such as screw cramp (E).

Figure 6F:
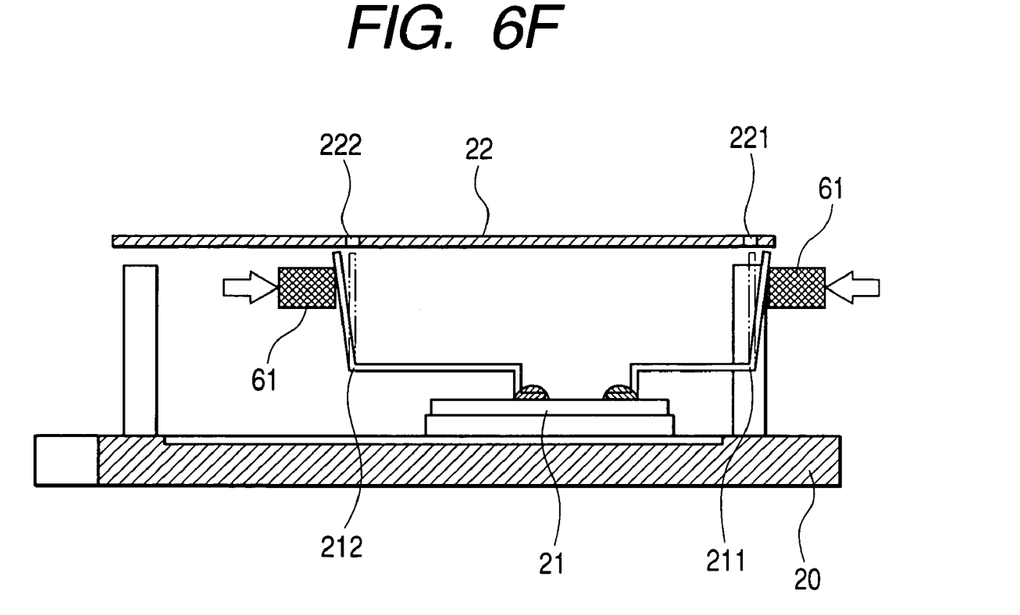
FIG. 6F–6G is an explanation view (3) showing an assembling method (3) of the connecting structure of printed circuit boards according to the embodiment of the invention.

Next, the tip ends of the control lead 211 and the power lead 212 are held down by jigs 61 from outside so as to be substantially perpendicular, and the control substrate 22 is disposed from thereabove.

In the control substrate 22, the control through-hole 221 and the power through-hole 222 are opened. The control lead 211 and the power lead 212 are inserted into the control through-hole 221 and the power through-hole 222, respectively (F).

That is, according to the embodiment of the invention, assured are the relative positional precision between the control lead 211 and the power lead 212, and the relative positional precision between the control through-hole 221 and the power through-hole 222. This facilitates assemble of the power substrate 21 and the control substrate 22.

When the jigs 61 are removed, the control lead 211 and the power lead 212 are expanded toward outside due to elasticity thereof, and the control lead 211 and the power lead 212 fall in such a situation that they contact to the control through-hole 221 and the power through-hole 222, respectively.

That is, according to the embodiment of the invention, since the leads and the through-holes are in contact with each other prior to soldering, it is possible to make sure a connection therebetween.

Figure 6G:
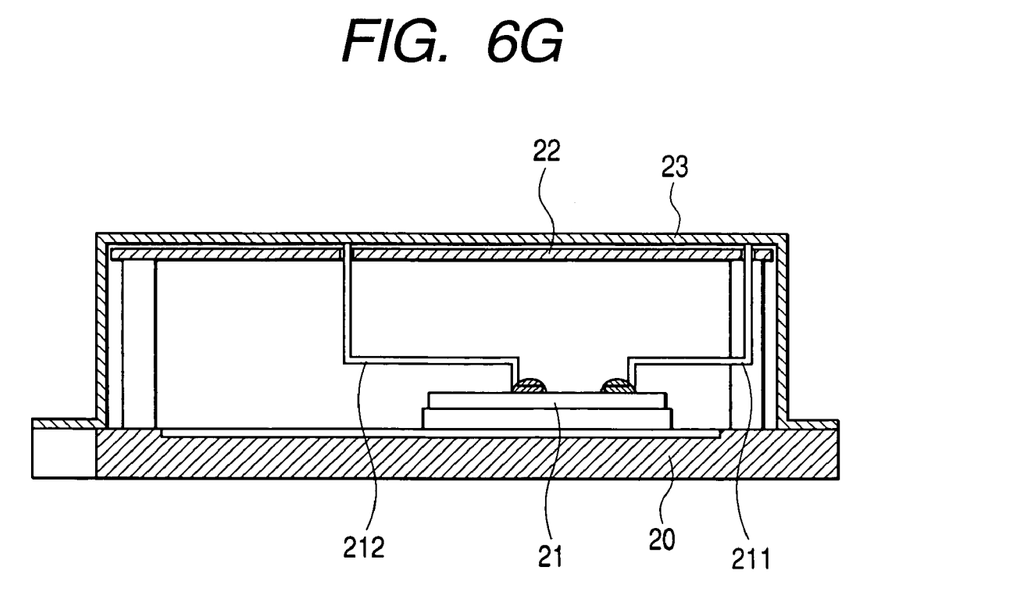

After that, the control lead 211 and the power lead 212, and, the control through-hole 221 and the power through-hole 222 are electrically connected by, for example, local flow-soldering, respectively. If necessary, the tip ends of the control lead 211 and the power lead 212, which are extended over the control substrate 22, may be cut off. Finally, by covering the base 20 with the lid 23 (G), a product is finished.

The above-described one is on the assumption that it is possible to hold down both of the control lead 211 and the power lead 212 by the jigs 61. However, there may be such a case that it is possible to hold down only one of the leads by the jig 61, because of existence of a large component, which is mounted on the substrate.

Figure 7F:
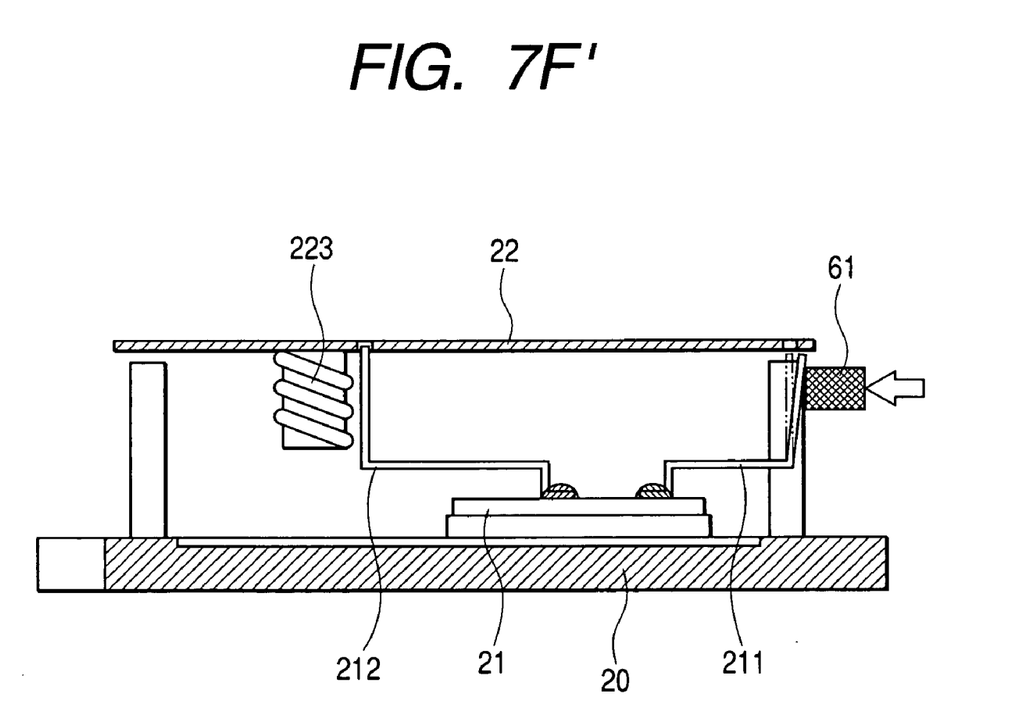
FIG. 7F is an explanation view (4) showing an assembling method of the connecting structure of printed circuit boards according to the embodiment of the invention.

FIG. 7F is an explanation view of an assembling method in this case. Since a large component 223 is mounted on an under surface of the control substrate 22, it is impossible to hold down the power lead 212 by a jig.

In this case, the power lead 212 (a lead which can not be held down by a jig) is formed to be longer than the control lead 211 (a lead which can be held down by the jig 61) by approximately 1 mm.

Further, in the forming process (C) of folding down the tip ends, a folding angle of the control lead 211 remains to be approximately 85 degrees, but a folding angle of the power lead 212 is made to be 90 degrees. Then, the tip ends is made to be perpendicular.

In this situation, the control lead 211 is held down from outside by the jig 61, and the control substrate 22 is disposed from above (F').

Then, the power lead 212 is inserted into the control through-hole 221 on ahead, and after that, the control lead 211 is inserted into the control through-hole 221.

That is, even when it is impossible to hold down one of the leads by the jig, this method makes it possible to surely insert the other of the leads into the through-hole.

When the jig 61 is removed, the control lead 211 and the power lead 212 are fixed by soldering to the control through-hole 221 and the power through-hole 222.

In a method of connecting printed circuit boards according to the embodiment of the invention, the forming process is applied to a lead after the lead has been attached to one of substrates. Thus, it becomes possible to stack and connect the printed circuit boards simply and precisely.

What is claimed is:

1. A method for connecting printed circuit boards comprising the following steps performed in the following order:

forming a terminal at one end of a lead portion of a lead frame;

fixing the terminal to a connecting pad formed on a surface of a first printed circuit board to attach the lead frame to the first printed circuit board;

cutting off a frame portion and a tie bar portion from the lead frame;

making the other end of the lead portion extend in an upward direction of the first printed circuit board;

inserting the lead portion into a through hole defined in a second printed circuit board; and fixing the lead portion to the through hole to connect the first printed circuit board and the second printed circuit board electrically.

2. The method according to claim 1, wherein the cutting-off separates the lead portion from the frame portion and the tie bar portion.

3. The method according to claim 1, wherein the making is to bend the lead portion to incline toward an outer side than a normal line of the first printed circuit board, the method further comprising:

supporting the lead portion by a jig to be along with the normal line of the first printed circuit board, before the inserting.

4. The method according to claim 3, wherein:
the lead portion is a plurality of lead portions;
the cutting-off is performed so that a first group of the lead portions extending from one edge of the lead frame have longer in length than a second group of the lead portions extending from another edge of the lead frame;
the making is to bend the first group of the lead portions to be along with the normal line of the first printed circuit board and to bend the second group of the lead portions to incline toward the outer side than the normal line of the first printed circuit board; and
the supporting is to support the second group of the lead portions by the jig before the inserting.

5. The method according to claim 3, wherein:
the lead portion is a plurality of lead portions;
a first group of the lead portions extend from one edge of the lead frame;
a second group of the lead portions extending from another edge of the lead frame;
the making is to bend the first group of the lead portions to be along with the normal line of the first printed circuit board and to bend the second group of the lead portions to incline toward the outer side than the normal line of the first printed circuit board;
the supporting is to support the second group of the lead portions by the jig before the inserting, and
immediately after the making, lengths from the bended portions of the lead portions of the first group to the other ends thereof are larger than those from the bended portions of the lead portions of the second group to the other ends thereof.

6. The method according to claim 3, wherein the step of making includes bending the lead portion to be 85° from the first printed circuit board.

7. The method according to claim 3, further comprising, after the step of cutting off a frame portion and before the step of making, fixing the first circuit board to a base.

8. The method according to claim 1, wherein the step of fixing the terminal includes connecting the terminal to the connecting pad by flow soldering.

9. The method according to claim 1, wherein the lead frame has both power and control leads.

10. The method according to claim 1, wherein the first printed circuit board is a power board and the second printed circuit board is a control board.

* * * * *